United States Patent [19]
Wong

[11] Patent Number: 5,614,032
[45] Date of Patent: Mar. 25, 1997

[54] TERPENE-BASED METHOD FOR REMOVING FLUX RESIDUES FROM ELECTRONIC DEVICES

[75] Inventor: Ching-Ping Wong, Lawrenceville, N.J.

[73] Assignee: AT&T Corp., Murray Hill, N.J.

[21] Appl. No.: 285,679

[22] Filed: Aug. 4, 1994

[51] Int. Cl.$^6$ ............................................. B08B 3/08
[52] U.S. Cl. ............................ 134/38; 134/40; 134/42
[58] Field of Search ................................. 134/40, 42, 38; 252/170, DIG. 8

[56] References Cited

U.S. PATENT DOCUMENTS

| | | | |
|---|---|---|---|
| 3,886,099 | 5/1975 | Hall | 134/42 X |
| 4,640,719 | 2/1987 | Hayes et al. | 134/40 |
| 4,740,247 | 4/1988 | Hayes et al. | 134/42 |
| 4,867,800 | 9/1989 | Dishart et al. | 134/40 |
| 4,983,224 | 1/1991 | Mombrun et al. | 252/170 X |
| 5,031,648 | 7/1991 | Lutener et al. | 252/170 X |
| 5,120,371 | 6/1992 | Bolden et al. | 134/40 |
| 5,238,504 | 8/1993 | Henry | 134/40 |
| 5,340,407 | 8/1994 | Bolden et al. | 134/26 |

FOREIGN PATENT DOCUMENTS

| | | |
|---|---|---|
| 354027 | 2/1990 | European Pat. Off. . |

OTHER PUBLICATIONS

"Aqueous and Semi–Aqueous Cleaning Processes," G.M. Wenger et al., *AT&T Technical Journal*, Mar./Apr. 1992, pp. 45–51.

"Monolithic High Voltage Gated Diode Crosspoint Array IC," H.T. Weston et al., IEDM Technical Digest (International Electronics Device Meeting), San Francisco, CA, Dec. 1982, pp. 85–88.

*Primary Examiner*—Jan H. Silbaugh
*Assistant Examiner*—Saeed Chaudhry
*Attorney, Agent, or Firm*—Roderick B. Anderson; Martin I. Finston

[57] ABSTRACT

In a method for cleaning using terpene compositions, the generation of harmful precipitates is substantially eliminated or significantly reduced by adding a polar solvent, such as isopropyl alcohol, to the terpene composition. One to twenty percent of the cleaning composition should be alcohol, although it is preferred that it be in the five to fifteen percent range. The upper limit reflects primarily the desire to reduce the flammability of the solvent. Alternatively, the electronic devices can be rinsed with a terpene, alcohol mixture, but this alternative is much less preferred because of the flammability problem.

7 Claims, 1 Drawing Sheet

5,614,032

TERPENE-BASED METHOD FOR REMOVING FLUX RESIDUES FROM ELECTRONIC DEVICES

TECHNICAL FIELD

This invention relates to cleaning methods and, more particularly, to methods for cleaning electronic devices.

BACKGROUND OF THE INVENTION

One step in the fabrication of modern electronic devices such as hybrid integrated circuits (HICs) and printed wiring boards (PWBs) is the use of solder flux, normally a rosin, to insure good bonding of solder elements to copper or aluminum conductors of the devices. After the soldering operation, residual rosin flux must be cleaned from the devices, and for years this was done by using cleaning solvents comprising chlorinated hydrocarbons or chlorinated fluorocarbons (CFCs). The patents of Hayes et al., U.S. Pat. No. 4,740,247, and U.S. Pat. No. 4,640,719, incorporated herein by reference, point out that such solvents are harmful to the environment, and that residual rosin flux can effectively be removed by a cleaning solvent having terpene as its active ingredient, which in turn can be rinsed with water. Terpene compositions are biodegradable, non-toxic and are essentially harmless to the environment.

A system for cleaning PWBs with terpene compositions is described in the paper, "Aqueous and Semi-Aqueous Cleaning Processes," G. M. Wenger et al., *AT&T Technical Journal*, Vol. 71, No. 2, March/April 1992, pp. 45–51, incorporated herein by reference. It is preferred that the devices be submerged in the terpene composition prior to rinsing, and apparatus for accomplishing this is described. Devices that have been cleaned as described in the Wenger et al. paper have unfortunately been found to be susceptible to failure. Particularly, HIC devices for supporting relatively high voltages have been found to be subject to failure. Microscopic examinations of the components of such devices have shown that many of such failures are due to a precipitate generated within the cleaning solvent during the cleaning operation. When illuminated with ultraviolet light, this precipitate fluoresces and is therefore readily identifiable.

SUMMARY OF THE INVENTION

I have found that the precipitate problem can be substantially eliminated or significantly reduced by adding a polar solvent, such as isopropyl alcohol, to the terpene composition. One to twenty percent of the cleaning composition should be alcohol, although it is preferred that it be in the five to fifteen percent range. The upper limit reflects primarily the desire to reduce the flammability of the solvent. Alternatively, the electronic devices can be rinsed with a terpene and alcohol mixture, but this alternative is much less preferred because of the flammability problem.

These and other objects, features and benefits of the invention will be better understood from a consideration of the following detailed description taken in conjunction with the accompanying drawing.

DETAILED DESCRIPTION

Figure 1:
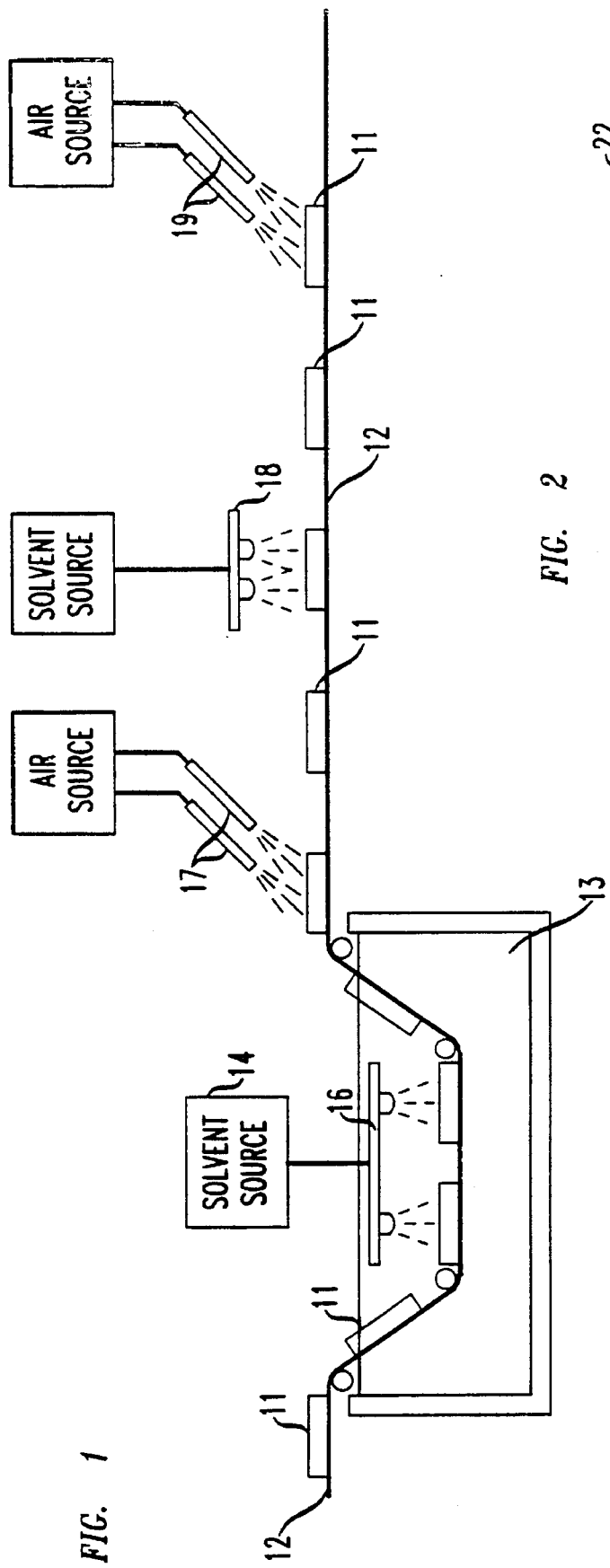
FIG. 1 is a schematic representation of a cleaning method in which the invention may be used.

Referring now to FIG. 1, there is shown schematically apparatus for cleaning electronic devices using a terpene composition, the apparatus and method being described more fully in the aforementioned Wenger et al. paper. A plurality of devices 11 to be cleaned are placed on a conveyor belt 12 which moves them from left to right, as indicated by the arrow. The devices 11 are first submerged in a cleaning solvent 13 which comprises a terpene composition along with a surfactant. Solvent from a source 14 is forcefully directed at surfaces of the submerged printed wiring boards by a spray bar 16. Cleaning in this manner minimizes the possibility of an accidental explosion caused by vaporized solvent. HICs, that is, electronic devices comprising ceramic or semiconductor substrates each having at least one printed circuit on at least one surface which in turn supports one or more integrated circuit chips, are commonly cleaned by this process.

After exposure to the cleaning solvent, the devices 11 are directed past a plurality of air jets 17 which direct air forcefully at the surfaces of each device to blow away most of the residual solvent. The devices 11 are next rinsed by water applied by a spray bar 18. After rinsing, they are again exposed to air jets 19 which remove and dry water from the surfaces. As is described in the Wenger et al. paper, cleaning with the solvent and rinsing with water are normally done in two separate machines; these functions are shown as being combined in FIG. 1 only for reasons of brevity. The above cleaning method is considered a major advance in the art because the solvent is capable of cleaning oils, greases and residual solder flux, a form of rosin, from electronic devices without causing serious air or water pollution, as is true of previously used solvents.

Figure 2:
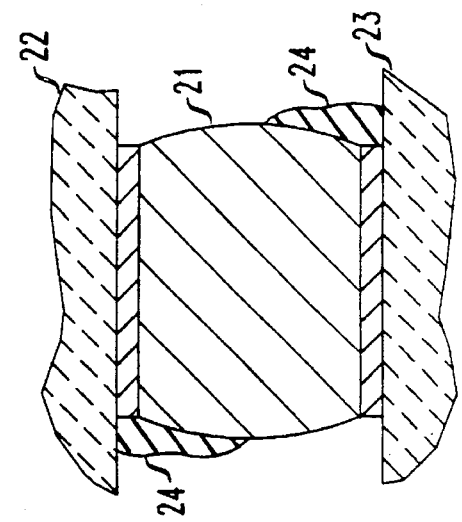
FIG. 2 is a schematic view of a soldered contact cleaned in accordance with the prior art.

The foregoing method has been used to clean residual rosin flux from HICs of a type known as the GDX, or gated diode crosspoint switch device. The GDX is described, for example, in the paper, "Monolithic High Voltage Gated Diode Crosspoint Array IC," H. T. Weston et al., *IEDM Technical Digest* (International Electronics Device Meeting), San Francisco, Calif., December 1982, pp. 85–88, hereby incorporated herein by reference. These devices generate exceptionally high voltages during operation, typically in excess of three hundred fifty volts, and are therefore particularly susceptible to problems resulting from incomplete cleaning. Referring to FIG. 2, there is shown a solder connection 21 for connecting an integrated circuit chip 22, such as a GDX device, to a ceramic substrate 23. It has been found that after the cleaning method, a microscopic white precipitate 24 may be deposited on or near the solder interconnection as shown. Such precipitate constitutes a source of contamination and may affect the carefully controlled impedance between the chip 22 and substrate 23, particularly under conditions of relatively high voltage.

While much of this precipitate is removed during the water rinse process, some of it stubbornly remains, and we have found that its presence can be more easily determined by illuminating the solder joints with ultraviolet light during microscopic inspection. We have found that if the cleaning solvent 13 contains water, such water molecules will be contained within the precipitate 24 and cause corrosion of the soldered contact. As described in the copending application of C. P. Wong, Ser. No. 08/220,478, filed Mar. 31, 1994, incorporated herein by reference, the corrosion problem can be eliminated or significantly reduced by removing the water molecules from the cleaning solvent prior to use. Even with this improvement, however, the precipitate 24 may still interfere with operation of an electronic device, particularly a high voltage HIC such as the GDX.

I have found that the molecules constituting precipitate 24 are polar molecules which can be dissolved by certain polar solvents. In particular, isopropyl alcohol has been found to constitute a solvent of the precipitates, and if one adds to the cleaning solvent 13 sufficient isopropyl alcohol (IPA) that the IPA constitutes between five and fifteen percent of the mixture, no precipitates 24 are produced, or such production is significantly reduced.

While as much as twenty percent by weight of the mixture may be IPA, it is usually desirable to limit the dilution of the terpene active ingredient of the solvent, and also to reduce flammability of the mixture. As is known, terpene is particularly useful for removing rosin flux residues. The cleaning solvent that was used comprised, before the addition of IPA, about ninety percent by weight of d-limonene (a terpene) and ten percent by weight of methyl laurate, an aliphatic ester surfactant; such solvent is commercially available under the trade name EC-7R from Petraferm, Inc. of Fernandina Beach, Fla. Analysis of the precipitate shows that methyl laurate is a significant contributor. The precipitate typically contains components of terpene, methyl laurate and water, which together constitute polar molecules. As little as one percent IPA reduces precipitate quantity. Polar solvents other than IPA could be used for dissolving the polar precipitate, but it appears that such material should be a solvent of water, rosin and terpene. Isobutyl alcohol may alternatively be used, and other alcohols could perhaps also be used. Experiments also show that the lead in the solder contributes to the precipitate. Lead pellets immersed in terpene change the color of the terpene from clear to yellow, but if IPA is added to the terpene prior to immersion, there is no such change in color.

While it is strongly preferred that the IPA be added to the solvent 13 of FIG. 1, a mixture of IPA and terpene could be used as a separate rinse, and this would perhaps be effective in dissolving or dislodging the precipitate 24 of FIG. 2. Since such a rinse station would increase the dangers of flammability and explosion, it is not a recommended or preferred alternative. Various other embodiments and modifications may be made by those skilled in the art without departing from the spirit and scope of the invention.

I claim:

1. A method for cleaning an electronic device having thereon rosin flux residue, said method comprising the step of immersing said device in a cleaning solvent comprising terpene, thereby to remove said residue, wherein:

said cleaning solvent further comprises alcohol in an amount that is one to twenty percent, by total weight, of said cleaning solvent;

the alcohol consists essentially of at least one of isopropyl alcohol and isobutyl alcohol; and the amount of alcohol is, furthermore, sufficient to substantially prevent the formation of polar precipitates within the cleaning solvent during said cleaning.

2. The method of claim 1 wherein:

the electronic device is a hybrid integrated circuit.

3. The method of claim 2 wherein:

the hybrid integrated circuit is designed to support voltages in excess of three hundred volts.

4. The method of claim 1 wherein:

the cleaning solvent comprises d-limonene and an aliphatic ester surfactant.

5. The method of claim 4 wherein:

the surfactant is methyl laurate.

6. The method of claim 5 wherein:

the electronic device is a hybrid integrated circuit designed to support voltages in excess of three hundred volts.

7. The method of claim 6 wherein:

the alcohol is isopropyl alcohol;

and the isopropyl alcohol comprises five to fifteen percent by weight of the cleaning solvent.

* * * * *